(12) United States Patent
Partee et al.

(10) Patent No.: US 12,112,261 B2
(45) Date of Patent: Oct. 8, 2024

(54) SYSTEM AND METHOD FOR MODEL PARAMETER OPTIMIZATION

(71) Applicant: Cray Inc., Seattle, WA (US)

(72) Inventors: Samuel H. Partee, Seattle, WA (US); Benjamin J. Robbins, Seattle, WA (US); Michael F. Ringenburg, Seattle, WA (US)

(73) Assignee: Hewlett Packard Enterprise Development LP, Spring, TX (US)

(*) Notice: Subject to any disclaimer, the term of this patent is extended or adjusted under 35 U.S.C. 154(b) by 1180 days.

(21) Appl. No.: 16/714,347

(22) Filed: Dec. 13, 2019

(65) Prior Publication Data

US 2021/0182357 A1    Jun. 17, 2021

(51) Int. Cl.
*G06N 3/08* (2023.01)
*G01W 1/02* (2006.01)
*G06N 20/20* (2019.01)

(52) U.S. Cl.
CPC ............... *G06N 3/08* (2013.01); *G01W 1/02* (2013.01); *G06N 20/20* (2019.01)

(58) Field of Classification Search
CPC .................................. G06N 3/08; G06N 20/20
See application file for complete search history.

(56) References Cited

U.S. PATENT DOCUMENTS

2021/0064802 A1* 3/2021 Albert .................. G06N 3/0454
2021/0271934 A1* 9/2021 White .................... G06K 9/623

FOREIGN PATENT DOCUMENTS

WO    WO-0205208    1/2002

OTHER PUBLICATIONS

Alexander, Daniel C., et al; "Image quality transfer and applications in diffusion MRI"; Feb. 19, 2017; 63 pages.
Keshavarzzadeh, V., et al.; "Parametric topology optimization with multiresolution finite element models"; Mar. 13, 2019; 23 pages.

\* cited by examiner

*Primary Examiner* — Shirley X Zhang
(74) *Attorney, Agent, or Firm* — Trop, Pruner & Hu, P.C.

(57) ABSTRACT

One embodiment can provide a method and system for tuning parameters of a numerical model of a physical system. During operation, the system can obtain, using a machine-learning technique, a parameter-transform model for mapping parameters of the numerical model at a first resolution to parameters of the numerical model at a second resolution, the second resolution being higher than the first resolution. The system can perform a parameter-tuning operation on the numerical model at a first resolution to obtain a first set of tuned parameters and apply the parameter-transform model on the first set of tuned parameters to obtain a second set of tuned parameters at a second resolution. The system can then generate behavior information associated with the physical system by running the numerical model at the second resolution using the second set of tuned parameters.

13 Claims, 6 Drawing Sheets

SYSTEM AND METHOD FOR MODEL PARAMETER OPTIMIZATION

BACKGROUND

This disclosure is generally related to numerical modeling. More specifically, this disclosure is related to a system and method for optimizing parameters of numeric models. Large-scale, high-resolution numerical models are widely used in many scientific domains, including oceanography, high-energy physics, climate science, and material science. These models often have tens or hundreds of free parameters that need to be tuned in order to optimize the models. However, tuning for high-resolution model runs is an expensive and time-consuming process that involves many executions of the model with different sets of parameters at the resolution of interest.

BRIEF DESCRIPTION OF THE FIGURES

In the figures, like reference numerals refer to the same figure elements.

DETAILED DESCRIPTION

Figure 1:
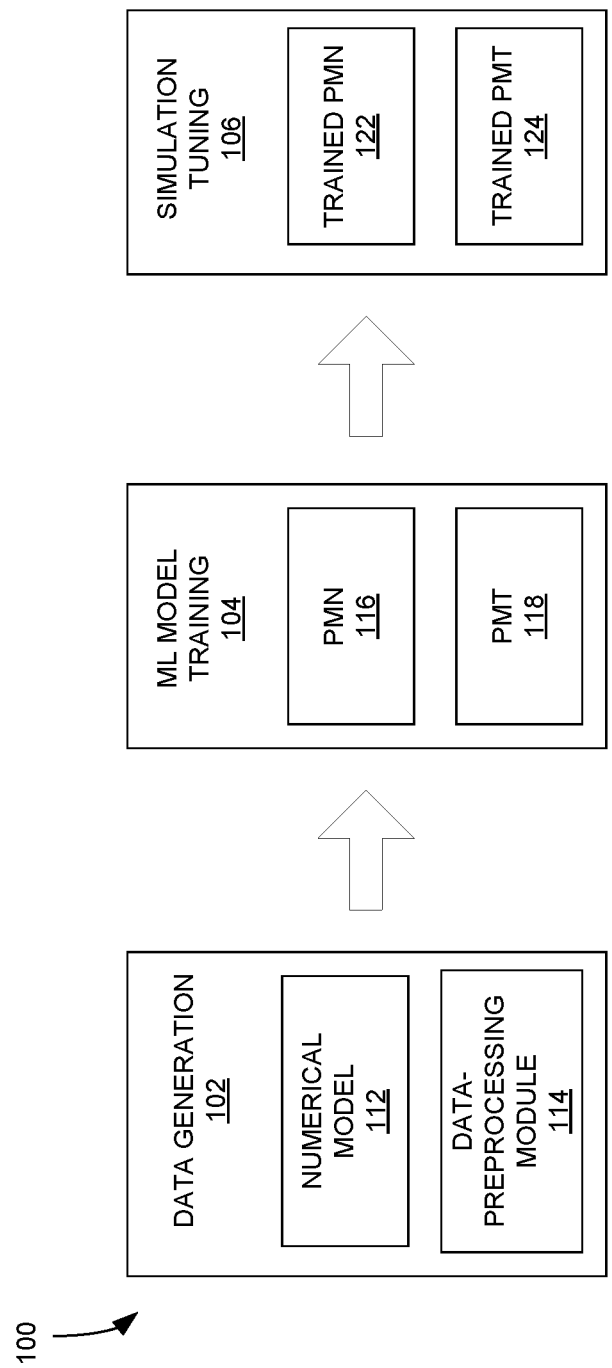
FIG. 1 illustrates an exemplary model parameter optimization (MPO) framework, according to one embodiment.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

The embodiments described herein solve the technical problem of optimizing parameters of a numerical model in a cost-effective way by allowing model users and developers to tune the numerical models at a low resolution and then convert the tuned parameters to their high-resolution equivalents. More specifically, the system uses a machine-learning technique to learn a mapping between the low-resolution model parameters (e.g., optimal model parameters obtained by tuning the model at the low resolution) and high-resolution parameters (e.g., optimal model parameters that can be used to run the simulation at a high resolution). To do so, a deep neural network (referred to as the parameter mapping network or PMN) can be trained to deduct low-resolution parameters from low-resolution simulation output. One can also feed high-resolution model outputs to the trained PMN to obtain a mapping space that corresponds to a low-resolution estimation of the high-resolution model parameters. The corresponding low-resolution estimation of the high-resolution model parameters (referred to as a low-resolution mapping space) and the actual parameters used for running the high-resolution model (referred to as a high-resolution parameter space) can then be used to train a second machine-learning model (referred to as the parameter mapping transform or PMT) to learn the relationship between the low-resolution mapping space and the high-resolution parameter space.

One embodiment can provide a method and system for tuning parameters of a numerical model of a physical system. During operation, the system can obtain, using a machine-learning technique, a parameter-transform model for mapping parameters of the numerical model at a first resolution to parameters of the numerical model at a second resolution, the second resolution being higher than the first resolution. The system can perform a parameter-tuning operation on the numerical model at a first resolution to obtain a first set of tuned parameters and apply the parameter-transform model on the first set of tuned parameters to obtain a second set of tuned parameters at a second resolution. The system can then generate behavior information associated with the physical system by running the numerical model at the second resolution using the second set of tuned parameters.

In a variation on this embodiment, obtaining the parameter-transform model can include: obtaining parameter-transform training samples comprising a set of training parameters of the numerical model associated with the first resolution and a corresponding set of training parameters of the numerical model associated with the second resolution, and training the parameter-transform model using the obtained parameter-transform training samples.

In a further variation, the system can further obtain, using a second machine-learning technique, a parameter-mapping model for mapping an output of the numerical model to actual parameters used for running the numerical model at the first resolution.

In a further variation, the set of training parameters of the numerical model associated with the first resolution can be obtained by applying the parameter-mapping model to outputs of the numerical model running at the second resolution, and the set of training parameters associated with the second resolution comprises actual parameters used for generating the outputs by executing the numerical model at the second resolution.

In a further variation, the parameter-mapping model comprises a deep neural network.

In a further variation, the system can obtain parameter-mapping training samples, which comprise parameters within a predetermined parameter space and outputs of the numerical model generated by executing the numerical model at the first resolution using the parameters within the predetermined parameter space. The system can further train the parameter-mapping model using the obtained parameter-mapping training samples.

In a further variation, obtaining the parameter-mapping training samples can include up-mapping the outputs of the numerical model from the first resolution to the second resolution.

In a further variation, obtaining the parameter-mapping training samples can include preprocessing outputs of the numerical model to facilitate the training of the parameter-mapping model.

In a variation on this embodiment, the numerical model can include one or more of: an ocean model, an earth model, an atmosphere model, and a climate model.

In a variation on this embodiment, the parameter-transform model comprises a gradient-boosting regression model.

Model Parameter Optimization

Modular Ocean Model 6 (MOM6) is an example of the complex, computationally costly numerical model. It is a numerical representation of the ocean fluid with applications from the process scale to the planetary circulation scale. In this disclosure, we use MOM6 as an example to describe the principle of operation of the Model Parameter Optimization (MPO) framework. However, the scope of the disclosure is not limited to the application of the MOM6.

MOM6 can be a useful tool for climate research. However, such global simulation requires significant computational resources (288 core-hours per model year for a modest resolution). Note that, like other weather or climate models (e.g., the Community Atmosphere Model (CAM) and the Community Earth System Model (CESM)) MOM6 can use a grid (a two- or three-dimensional grid) to map out a physical space, where the model output can be evaluated at each grid point. The resolution can be increased or decreased by increasing or decreasing the number of grid points, respectively, within the physical space (e.g., within a particular latitude and longitude range). While increasing the resolution tends to improve the skill of a model, a significant computational cost is incurred. In many situations, high-resolution models are needed for accurate simulations of phenomena to be captured, because low-resolution models do not resolve enough detail for scientific inquiry.

MOM6 has over 300 free (i.e., unconstrained) model parameters that control the simulation behavior of the model. Some of these parameters are used in parameterizations, a method of capturing the effect of physical processes that are not being resolved in the model. These parameters can be used to "tune" the model defined as "choosing parameter values in such a way that a certain measure of the deviation of the model output from selected observations or theory is minimized or reduced to an acceptable range." This process of model parameter tuning can be painstakingly slow, especially for high-resolution models, due to the computational costs of running the high-resolution model for long enough to achieve a reasonable steady-state) and because of the large parameter space to be explored. To solve this problem, embodiments described herein provide a system and method for accelerating the process of numerical model tuning by creating a mapping between parameter spaces of a model at two different resolutions through machine learning.

FIG. 1 illustrates an exemplary model parameter optimization (MPO) framework, according to one embodiment. MPO framework 100 can include a data-generation stage 102, a machine-learning (ML)-model-training stage 104, and a simulation-tuning stage 106.

Data-generation stage 102 can involve the operations of the numerical model being tuned (numerical model 112) and a data-preprocessing module 114. In data-generation stage 102, low-resolution data from a number of models with pre-configured parameter spaces can be generated. In other words, numerical model 112 can run using a number of parameters within the pre-configured parameter space in order to generate simulation data. In one example, the double-gyre model of MOM6 is the numerical model of interest, and the parameters targeted for tuning can include eddy viscosity (KH) and thickness diffusion (KHTH). These two parameters were chosen because they represent different aspects of the effect of turbulence. KH effectively increases the friction throughout the ocean basin. KH reduces horizontal gradients in velocity as energy is transferred more efficiently between fluids moving at two different speeds. KH also serves to remove energy from the system by acting as a dampening effect on momentum. In the case of the double-gyre system, a high viscosity stretches the western boundary current over a wider distance. This weakens the boundary current's effect on the basin. KHTH acts on another type of turbulence in the model that arises from baroclinic instability. Turbulence from baroclinic instability arises from the vertical changes in density of the ocean model. KHTH serves to extract energy from the sloping gradients in the vertical and flattens them.

Data-preprocessing module 114 can preprocess the simulation data before it can be used as training samples for a machine-learning model. The outputs from many physical models, such as MOM6, are simulated on a multi-dimensional grid of points where values corresponding to the physical phenomena being simulated are captured. Collapsing this multi-dimensional grid of simulation data into a dataset for machine learning largely depends on the simulation model. In some embodiments, data-preprocessing module 114 can extract simulation features at each grid point and combine them into a TFRecord dataset. TFRecord is a simple format for storing a sequence of binary records. Moreover, one cannot use model data at two different resolutions to infer from or train the same neural network because data at the two different resolutions have different dimensions. To solve this problem, data-preprocessing module 114 can use a conservative remapping technique to remap the grids between the two different resolutions. In some embodiments, data-preprocessing module 114 can implement a Climate Data Operations (CDO) tool to conduct the conservative remapping of grids between the two different resolutions.

Figure 2:
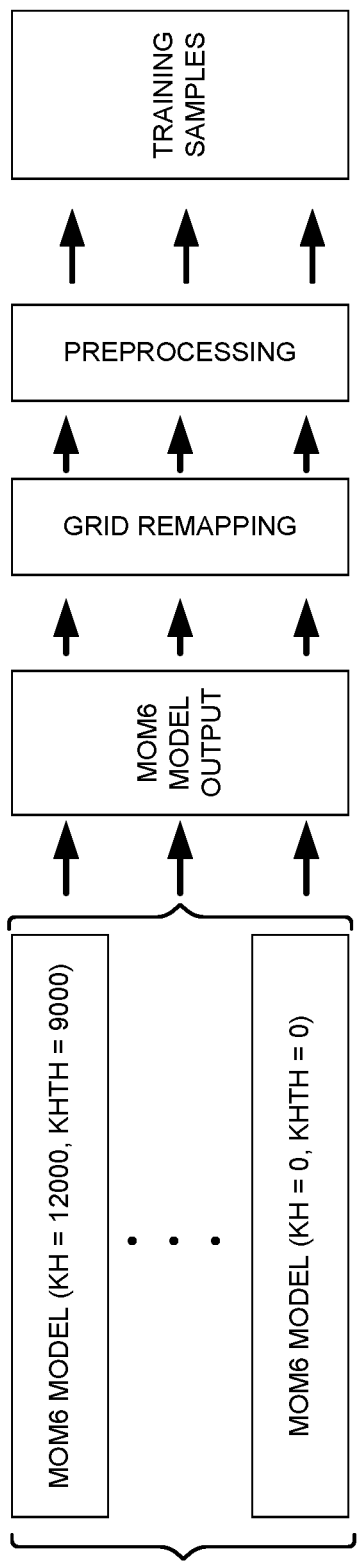
FIG. 2 illustrates an exemplary data-generation process, according to one embodiment.

FIG. 2 illustrates an exemplary data-generation process, according to one embodiment. In the example shown in FIG. 2, training data is generated using the MOM6 model. More specifically, in FIG. 2, low-resolution data can be generated using the pre-configured parameter spaces (e.g., KH and KHTH parameter spaces). In other words, the low-resolution data are generated by running the low-resolution MOM6 model using different parameter values. Due to its low computational cost, these low-resolution models can be simulated for a long time (e.g., 100 years), and each training sample can be obtained by averaging the data over a shorter time period (e.g., a five-year period). High-resolution data can be generated in a similar way. However, due to its high computational cost, these high-resolution models can be simulated for a shorter time period (e.g., 30 years). Note that the high-resolution data is not needed for training the parameter mapping network or PMN, thus less high-resolution data is needed. In some embodiments, thousands of low-resolution samples can be generated, whereas the number of high-resolution samples can be significantly fewer (e.g., hundreds).

If needed, the model data can be remapped using a conservative remapping technique to a different resolution. Two types of mapping may be used, down-mapping and up-mapping. Down-mapping condenses the size of the high-resolution grid so that it is the same as the low-resolution grid. Condensing the grid size decreases training time significantly. The training time is decreased due to the size of the final dataset being smaller by approximately a factor of 10. However, this approach does not come without caveats.

The high-resolution data loses information when condensed to a smaller grid. The down-mapping can make samples of the two different resolutions look more similar in respective physical quantities because the effect of increasing the resolution is blurred by the mapping. On the other hand, up-mapping remaps the low-resolution grid up to the size of the high-resolution grid. No data is lost when up-mapping, but the resultant dataset is relatively large, compared to the down-mapping strategy, especially when examining a number of features. Up-mapping ensures that the most information is being retained, which ensures the best quality parameter space mapping. In some embodiments, the system uses up-mapping on the low-resolution grid to ensure that both resolutions have the same grid size.

Subsequent to the grid remapping, the model data can be further processed to obtain data that is suitable for training a ML model. The output of the MOM6 model can include a multi-dimensional grid of points where numerical simulation values are recorded. Each of the points in the grid has values that correspond to physical processes captured by the model. The output can reach an arbitrary number of dimensions depending on the configuration of the MOM6 model. The first step toward reducing the dimensionality is to extract the tensor of output data with dimensions of latitude, longitude, layers (of the ocean basin), and time. Each step of time in the model is averaged so that the output data is reduced to multiple tensors per simulation run. Subsequently, the resultant tensors are reshaped into a vector of grid points. Starting at the first layer, each of the grid points is added to the resultant vector in parallel. Next, a value vector corresponding to physical values captured at each grid point is attached to the associated grid point, creating a 2D tensor of grid points and physical values. The 2D tensor of spatial grid points and corresponding value vectors is transformed into a single vector for each sample. The length of this vector depends on the ocean model, grid size, and number of features collected. Effectively the size is (grid points)×(layers)×(features). Each sample, represented as a vector of values, can be placed into a single dataset that is used for training the PMN. In some embodiments, the features in each sample can include one or more physical quantities captured at each grid point. For the ocean-model application, these features can include kinetic energy (KE), stream function value (STR), and sea surface height (SSH).

Returning to FIG. 1, ML-model-training stage 104 can include the training of two different ML models, a PMN model 116 and a PMT model 118. PMN model 116 can include a deep neural network (DDN) and be trained using the low-resolution simulation data obtained in data-generation stage 102 to predict the selected tunable parameters (e.g., the KH and KHTH parameters in the MOM6 model). The training process is supervised where the targets are the selected tunable parameters. The loss function that guides the training is the mean squared error between the predicted values of the tunable parameters and the actual tunable parameters used in the low-resolution run.

In some embodiments, PMN model 116 can include a deep regression network (DRN). DRNs are DNNs comprised of multiple hidden layers and can produce output through a final linear layer. In essence, a DRN is a non-linear regression with powerful function mapping ability. DRNs avoid having to construct a domain-specific discretization method, because their output directly correlates to the target variable to be predicted. This flexibility makes DRNs quickly applicable to many different domains. In a further embodiment, PMN model 116 can include a General Regression Neural Network (GRNN) that uses probability density functions to implement a one-pass learning algorithm where back propagation is not required. Using a GRNN, a process can be modeled by training the GRNN on the inputs and outputs of the model along with its current state. The GRNN can also be used as a controller for the inputs of the process. After each iteration of the process, the GRNN can adjust the state of the network in one pass, creating a more time-efficient solution. In one embodiment, PMN model 116 can use rectified linear unit (ReLU) activation and the Adam optimizer. The DNN within PMN model 116 ends in a dense layer with two outputs for the two parameters (e.g, KH and KHTH) being mapped.

After a suitable accuracy is met by PMN model 116 (i.e., PMN model 116 is sufficiently trained), one can use PMN model 116 to generate data needed for training PMT model 118. More specifically, one can feed the outputs of high-resolution simulation runs to PMN model 116 without adjusting the weights of the network for error. Giving PMN model 116 a higher resolution sample after it has been trained to predict from low-resolution samples provides the mapping space. The mapping space is the tunable parameter space of the high-resolution simulation as if it were a low-resolution simulation. Since PMN model 116 has no knowledge that the resolution has been increased, when PMN model 116 is given a sample of higher resolution, it predicts the low-resolution tunable parameters of a low-resolution simulation most similar to the high-resolution simulation. In other words, the mapping space is the low-resolution estimation of the parameters of the high-resolution model. The difference between the mapping space and the actual high-resolution parameter space constitutes the effect of increasing the simulation resolution. By feeding PMN model 116 multiple instances of the high-resolution model run outputs, mapping values are generated that can be used to create a mapping between the parameter spaces. By comparing these mapping space values to the actual high-resolution tunable parameter spaces across multiple runs, the non-linear mapping between the parameter spaces can be learned by PMT model 118. More specifically, PMT model 118 can be trained using the mapping space values (i.e., parameters outputted by PMN model 116) and the actual high-resolution parameters.

In short, PMT model 118 distills the knowledge from PMN model 116 by regressing between the high-resolution parameter space and the mapping space (i.e., the low-resolution estimation of the parameters of the high-resolution model) across multiple simulations. The knowledge captured in PMT model 118 can be interpreted as an approximation of the non-linear, multi-objective function between the tunable parameter spaces of a model at two different resolutions. A brute force mapping of this approximation might compare every permutation of all tunable parameter values, but such an approach would be infeasible on practically any numerical model requiring thousands of computationally expensive simulations (e.g., an ocean model).

PMT model 118 can implement various machine-learning techniques to learn the mapping between the low-resolution parameters (i.e., parameters predicted by PMN model 116 based on outputs of high-resolution simulation runs) and the actual high-resolution parameters used in those simulation runs (i.e., the ground truth). In some embodiments, PMT model 118 implements a gradient-boosting algorithm, such as XGBoost. Typically, a gradient-boosting regression model is restricted to a single target variable; however, the model can be used to predict multiple target variables by wrapping it in a MultiOutputRegressor. Wrapping the gradient-boosting regression model in this fashion allows for the prediction of n variables in the tunable parameter space. In the MOM6 example, PMT model 118 can predict two tunable parameters (KH and KHTH).

Once trained to infer high-resolution tunable parameters from their low-resolution estimations, the PMT can be used as an oracle for tuning the selected parameters. Moreover, if certain parameters within the same model are strongly correlated (either linearly or non-linearly) with the selected parameters, the trained PMT can also be used for tuning such parameters.

Figure 3:
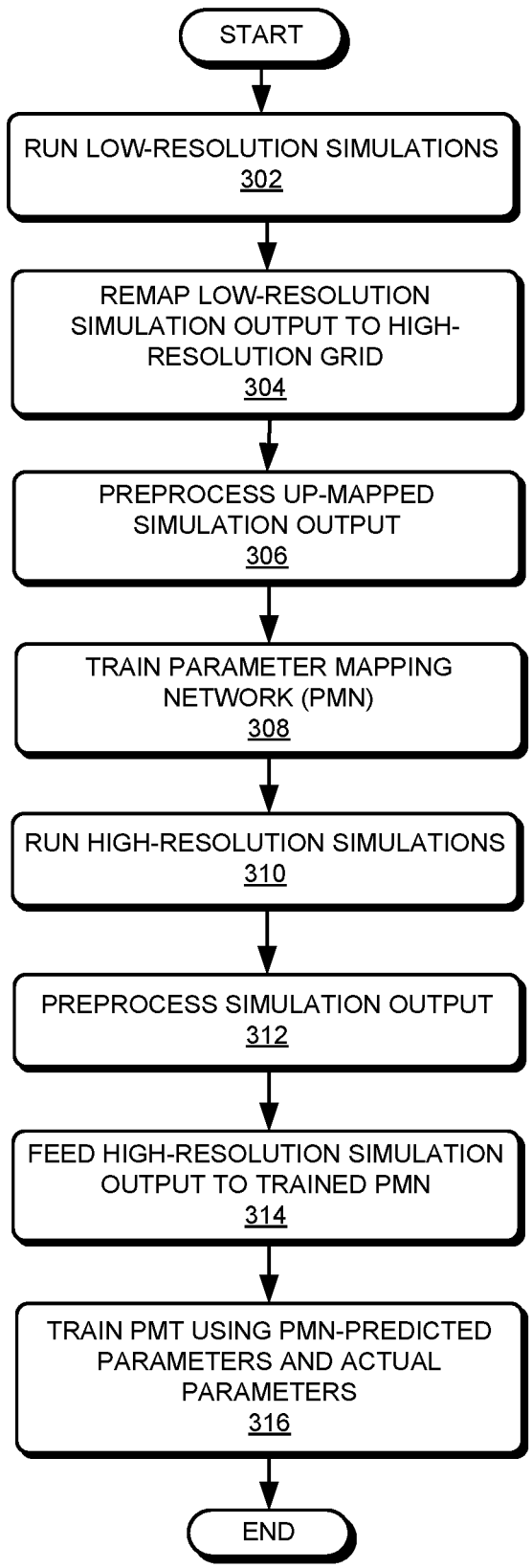
FIG. 3 presents a flowchart illustrating a process for training the PMN model and the PMT model, according to one embodiment.

FIG. 3 presents a flowchart illustrating the process of training the PMN model and the PMT model, according to one embodiment. During operation, the system runs a number of simulations using the model at a low resolution over a predetermined parameter space (operation 302). More specifically, each simulation run can be based on a unique combination of the target parameters, whereas other free parameters can be kept constant. Due to the low computational cost, these low-resolution simulations can run over a large time scale. In the MOM6 example, a low resolution can refer to a grid size of km (or roughly 0.5° longitude), whereas a high resolution can refer to a grid size of 20 km (or roughly 0.25° longitude). The single run simulation data can later be split into many samples. For example, a simulation can run on a time scale of 100 years, and its output can be divided into many samples, with each sample accounting for a five-year average. The low-resolution simulation output can be remapped, using an up-mapping technique, to a higher resolution grid (operation 304). The system can then preprocess the up-mapped simulation output to obtain samples suitable for training the PMN model (operation 306). As discussed previously, preprocessing the data can include extracting simulation features (e.g., KE, STR, and SSH in the MOM6 model) at each grid point and combining them into a TFRecord dataset.

The system can train the PMN using the preprocessed low-resolution simulation outputs along with the parameters used for running the low-resolution simulations (operation 308). The PMN can include a Deep Neural Network (DNN) that uses rectified linear unit (ReLU) activation and the Adam optimizer.

The system can also run a number of simulations using the model at a high resolution (operation 310) and preprocess the simulation output (operation 312). Due to the higher computational cost associated with the high-resolution simulation, the system runs the high-resolution simulation over a relatively smaller time scale. For example, instead of 100 years, the high-resolution model may only run for 30 years. This can result in a smaller number of high-resolution samples. However, the high-resolution samples are only needed for training the PMT model, which is a regression model and requires a smaller set of training samples than the DNN.

The high-resolution simulation outputs can be fed into the previously trained PMN, which predicts a set of tuning parameters (operation 314). Because the PMN is trained using low-resolution data, the parameters predicted by the PMN are different from the actual parameters used for running the high-resolution simulation. Such differences account for the effect of the resolution difference. In fact, the PMN predicts parameters as if the simulation is run at the low resolution. Hence, we always refer to the parameters predicted by the PMN as the low-resolution parameters. The system can then use the low-resolution parameters outputted by the PMN and the actual parameters used for running the high-resolution simulations to train the PMT model (operation 314). In some embodiments, the PMT model can implement a gradient-boosting algorithm, such as XGBoost. Unlike neural networks, XGBoost models cannot be optimized using traditional optimization methods in the Euclidean space. Instead, XGBoost models are trained by adding successive estimator trees iteratively until the model reaches an acceptable degree of accuracy. To form the tree, the model calculates a quality score for each potential new decision tree to be added. The best tree is then selected, using a greedy algorithm, based on its score. Smaller scores imply better structures.

Figure 4:
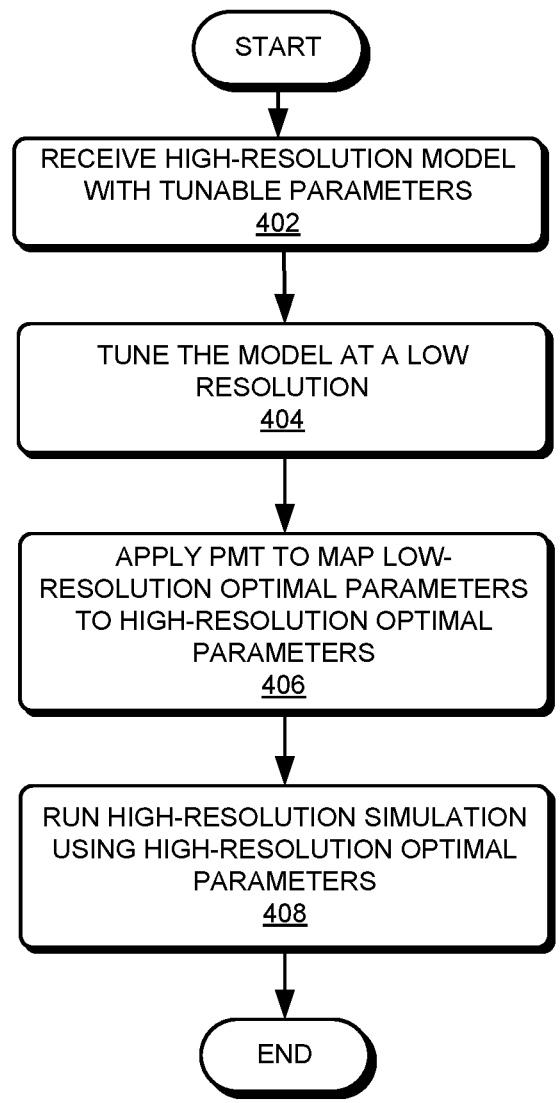
FIG. 4 presents a flowchart illustrating a process for tuning a high-resolution model, according to one embodiment.

Returning to FIG. 1, once the ML models are trained in ML-model-training stage 104, these trained ML models (i.e., trained PMN model 122 and trained PMT model 124) can be used to tune the parameters of the numerical model for future high-resolution simulation runs. FIG. 4 presents a flowchart illustrating the process of tuning a high-resolution model, according to one embodiment.

During operation, the system receives a numerical model with untuned parameters (operation 402). As discussed previously, high-resolution models are needed for accurate simulations of phenomena to be captured, because low-resolution models do not resolve enough detail. Using the ocean model (e.g., MOM6) as an example, certain turbulence can only be resolved by the high-resolution model. In order for the model to accurately emulate the natural phenomena (e.g., wind-driven ocean circulation), a number of tunable parameters need to be tuned to their optimal values. Conventionally, tuning those parameters requires executing the numerical models at the high resolution many times, which can be computationally expensive and time-consuming.

Instead of directly tuning the high-resolution model, the system can first tune the numerical model at a low resolution to obtain a parameter-tuning result (operation 404). Note that tuning the model at the low resolution can be done much faster, because the computational cost decreases exponentially with the reduced resolution. For example, a twofold reduction in resolution can reduce the computational cost eight times.

The low-resolution parameter-tuning result can include optimal or sub-optimal values of a number of tunable parameters. These parameter values are referred to as low-resolution parameters, because they are obtained using low-resolution simulations. The system can apply the previously trained PMT to map these low-resolution optimal/sub-optimal parameters to a set of high-resolution parameters (operation 406). As explained previously, the knowledge captured by the PMT through training can be interpreted as an approximation of the non-linear, multi-objective function between the tunable parameter spaces of a model at two different resolutions. The result of the mapping operation provides a set of optimal parameter values for the high-resolution model. The system can then run the model, using the mapped optimal high-resolution parameters, at the high resolution to generate an output that can accurately describe the to-be-simulated natural phenomena (operation 408). Such an output can include behavior information of the physical system (e.g., the ocean or the earth atmosphere) corresponding to the numerical model.

As one can see from FIG. 4, to obtain the optimal high-resolution simulation result, one only needs to run the high-resolution simulation once. It is no longer necessary to run multiple high-resolution simulations. Note that, although high-resolution simulations are needed during the training of the PMT, the number of runs needed for training the PMT is significantly smaller than the number of runs needed for tuning the high-resolution model. Moreover, once the PMT is learned, the mapping between the low-resolution and high-resolution parameter spaces can be applied to all future executions of the numerical model.

Figure 5:
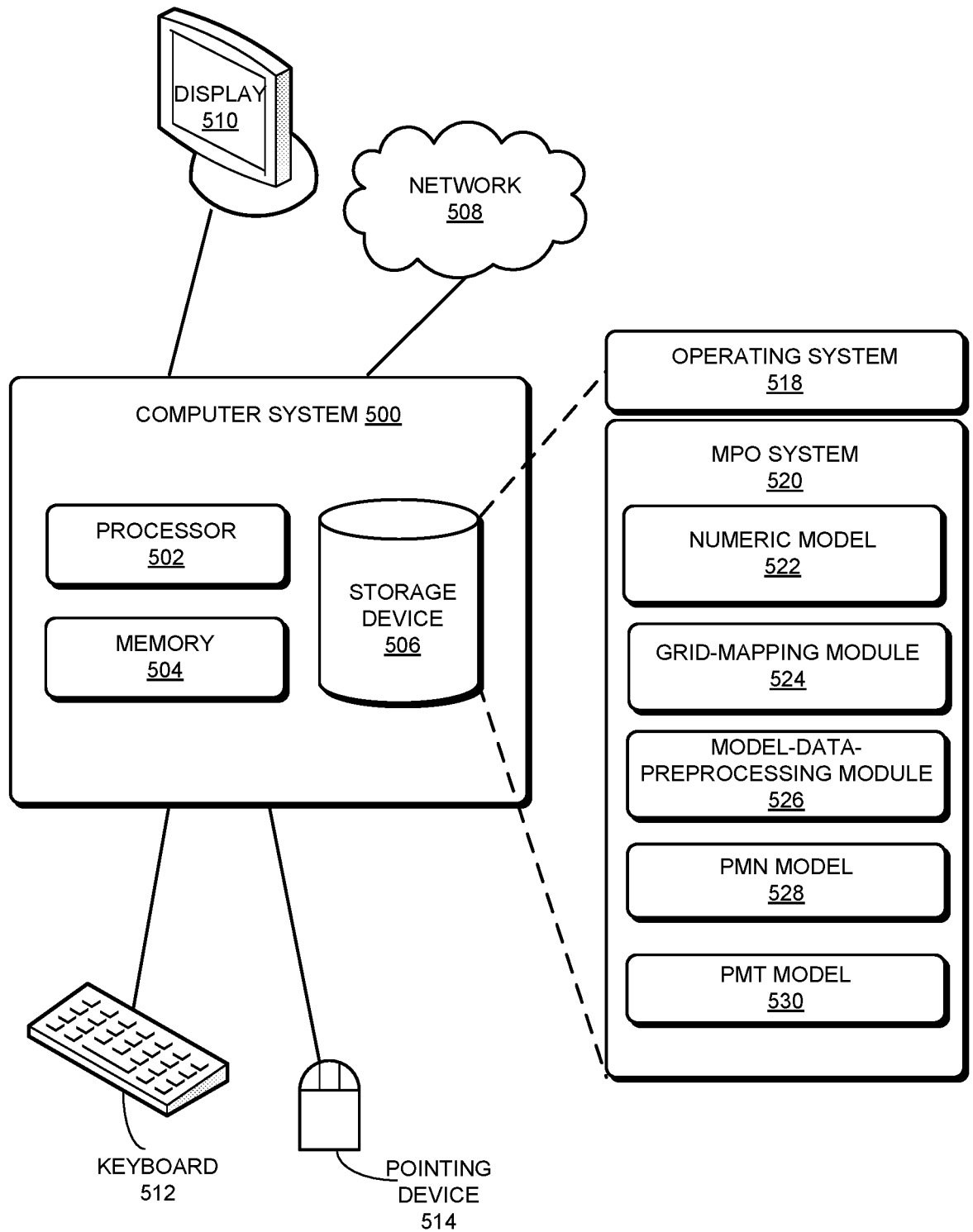
FIG. 5 illustrates an exemplary computer system that facilitates the model parameter optimization (MPO) framework, according to one embodiment.

FIG. 5 illustrates an exemplary computer system that facilitates the model parameter optimization (MPO) framework, according to one embodiment. Computer system 500 includes a processor 502, a memory 504, and a storage device 506. Computer system 500 can be coupled to a display device 510, a keyboard 512, and a pointing device 514, and can also be coupled via one or more network interfaces to network 508. Storage device 506 can store an operating system 518 and an MPO system 520.

MPO system 520 can include instructions, which when executed by computer system 500 can cause computer system 500 to perform methods and/or processes described in this disclosure. MPO system 520 can include instructions for executing a numerical model (numerical model 522), instructions for remapping the model output to a grid of a different resolution (grid-remapping module 524), instructions for preprocessing the model data such that they can be used to train various machine-learning models (model-data-preprocessing module 526), instructions for training and applying a parameter mapping network (PMN) (PMN model 528), and instructions for training and applying a parameter mapping transform (PMT) model (PMT model 530).

Figure 6:
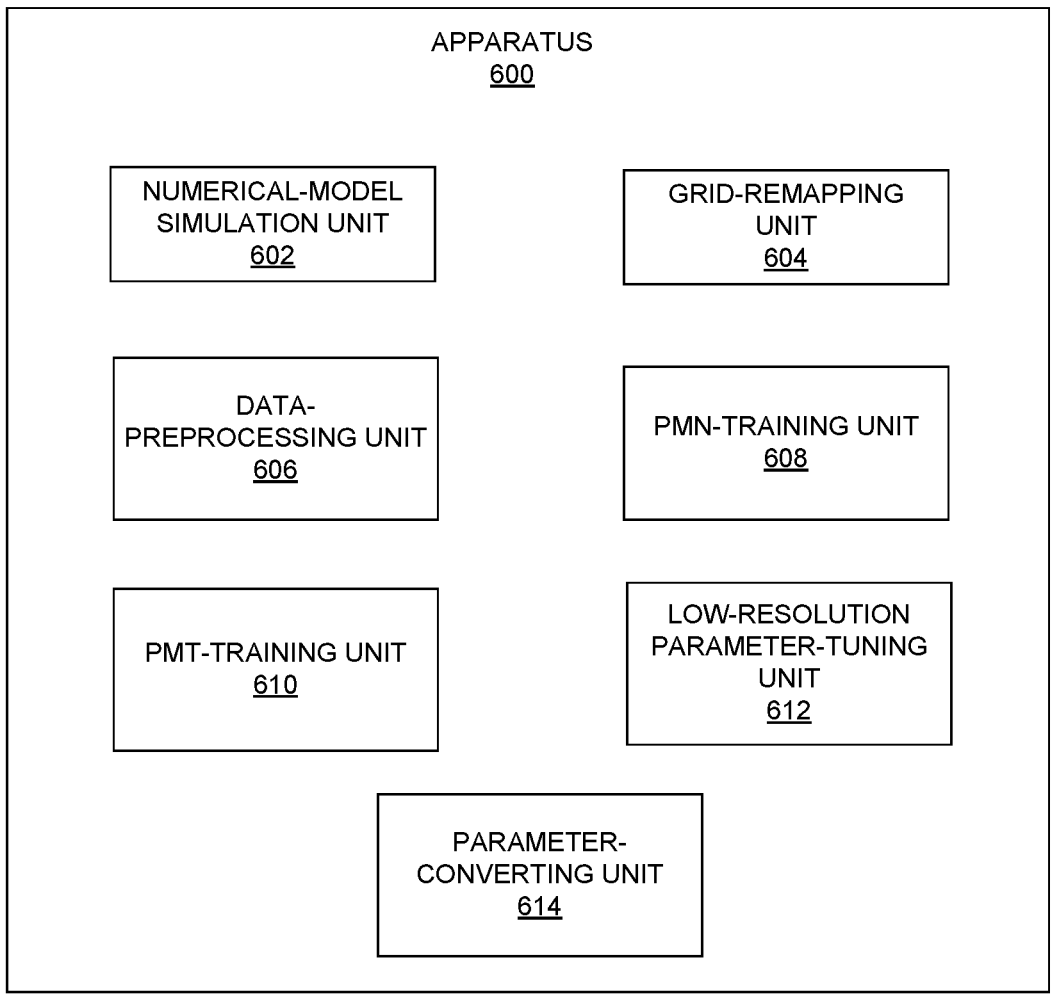
FIG. 6 illustrates an exemplary apparatus that facilitates operations of the model parameter optimization (MPO) framework, according to one embodiment.

FIG. 6 illustrates an exemplary apparatus that facilitates operations of the model parameter optimization (MPO) framework, according to one embodiment. Apparatus 600 can comprise a plurality of units or apparatuses which may communicate with one another via a wired, wireless, quantum light, or electrical communication channel. Apparatus 600 may be realized using one or more integrated circuits, and may include fewer or more units or apparatuses than those shown in FIG. 6. Further, apparatus 600 may be integrated in a computer system, or realized as a separate device(s) which is/are capable of communicating with other computer systems and/or devices.

Apparatus 600 can include a numerical-model-simulation unit 602 for performing simulations of the numerical model of interest. The numerical model of interest can typically be a large and complex model having many (hundreds, sometimes thousands of) tunable parameters. Such models are needed for studying and predicting the behavior of a large physical system (e.g., the ocean, the earth atmosphere, etc.). Numerical-model-simulation unit 602 can be configured to execute the simulation at different resolutions. The resolution of the numerical model can refer to a spatial resolution (indicated by the size of a 2D or 3D grid) or a temporal resolution (indicated by the size of the simulation step). To best emulate the physical system, many unconstrained or free parameters of the model need to be tuned to their optimal values.

Apparatus 600 can include a grid-remapping unit 604 capable of remapping the output of numerical-model-simulation unit 602. If numerical-model-simulation unit 602 executes the model at one resolution, grid-remapping unit 604 can remap the simulation output to a different resolution. Two types of mappings exist, up-mapping and down-mapping. In some embodiments, to make sure the sizes of simulation outputs from two different resolutions are the same, grid-remapping unit 604 can up-map the simulation output from the low-resolution simulation (which can have a larger grid size) to a higher resolution (which can have a smaller grid size). For a given simulation range (spatial or temporal), the lower-resolution model has a smaller number of grid points than that of the higher-resolution model.

Apparatus 600 can include a data-preprocessing unit 606 capable of preprocessing the simulation output as well as the grid-remapped simulation output such that they can be suitable for the machine-learning application. In some embodiments, data-preprocessing unit 606 can extract simulation features at each grid point and combine them into a TFRecord dataset.

Apparatus 600 can include a PMN-training unit 608 capable of training a PMN using outputs from low-resolution simulation runs of numerical-model-simulation unit 602. The PMN can include a DNN. In some embodiments, the DNN uses rectified linear unit (ReLU) activation and the Adam optimizer. The trained PMN can be used to map the parameters of a simulation run based on the simulation output.

Apparatus 600 can include a PMT-training unit 610 capable of training a PMT model, which can be used to map a low-resolution parameter space to a high-resolution parameter space. To train the PMT model, one first needs to obtain a number of high-resolution simulation outputs from numerical-model-simulation unit 602 and preprocess the high-resolution simulation outputs using data-preprocessing unit 606. The preprocessed high-resolution simulation outputs can then be sent to the PMN trained by PMN-training unit 608, which predicts a set of low-resolution parameters corresponding to the high-resolution simulation outputs. The difference between the predicted low-resolution parameters and the actual high-resolution parameters used for the high-resolution simulation reflects the effect of increasing the simulation resolution. PMT-training unit 610 can then use the low-resolution parameters predicted by the PMN and the actual high-resolution parameters used for running the simulation to learn the mapping between the low-resolution parameter space and the high-resolution parameter space.

Apparatus 600 can include a low-resolution parameter-tuning unit 612 capable of tuning the numerical model at a low resolution to obtain a set of optimal or sub-optimal low-resolution parameters. Tuning the numerical model can involve running the simulation, using numerical-model-simulation unit 602 many times at the low resolution. Apparatus 600 can also include a parameter-converting unit 614 capable of converting the set of optimal or sub-optimal low-resolution parameters to a set of optimal parameters that can be used for high-resolution simulation. The converted optimal high-resolution parameters can be used by numerical model simulation unit 602 to run a high-resolution simulation to obtain an optimal or sub-optimal simulation outcome of the numerical model. Such a simulation outcome can be used to better emulate or predict the behavior of the physical system corresponding to the numerical model.

Throughout this disclosure, an ocean model (e.g., MOM6) has been used as an example to describe the implementations of the MPO framework. However, the application of the MPO framework is not limited to an ocean model. In fact, the MPO framework can find applications in any numerical model of a physical system. The cost-saving effect of the MPO framework can be most significant for complex, large-scale numerical models (e.g., earth model, atmosphere model, climate model, etc.) as the computational cost for high-resolution parameter-tuning in these models can be extremely high. In the MOM6 example, the resolution refers to spatial resolution, where optimal parameters of a low-spatial-resolution simulation can be mapped to optimal parameters of a high-spatial-resolution simulation. In practice, the same parameter-mapping principle can also be applied to different temporal resolutions. For example, optimal parameters of a low-temporal-resolution simulation can be mapped to optimal parameters of a high-temporal-resolution simulation, thus eliminating the need to tune the model at the high-temporal resolution.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A computer-implemented method comprising:
   obtaining, using a first machine-learning technique, a parameter-transform model for mapping parameters of a numerical model other than the parameter-transform model at a first resolution to parameters of the numerical model at a second resolution, wherein the second resolution is higher than the first resolution, and obtaining the parameter-transform model comprises:
      obtaining parameter-transform training samples comprising a set of training parameters of the numerical model associated with the first resolution and a corresponding set of training parameters of the numerical model associated with the second resolution; and
      training the parameter-transform model using the obtained parameter-transform training samples;
   performing a parameter-tuning operation on the numerical model at the first resolution to obtain a first set of tuned parameters;
   applying the parameter-transform model on the first set of tuned parameters to obtain a second set of tuned parameters at the second resolution;
   generating behavior information associated with the physical system by running the numerical model at the second resolution using the second set of tuned parameters; and
   obtaining, using a second machine-learning technique, a parameter-mapping model for mapping an output of the numerical model to actual parameters used for running the numerical model at the first resolution.

2. The computer-implemented method of claim 1, wherein the set of training parameters of the numerical model associated with the first resolution is obtained by applying the parameter-mapping model to outputs of the numerical model running at the second resolution; and wherein the set of training parameters associated with the second resolution comprises actual parameters used for generating the outputs by executing the numerical model at the second resolution.

3. The computer-implemented method of claim 1, wherein the parameter-mapping model comprises a deep neural network.

4. The computer-implemented method of claim 1, further comprising:
   obtaining parameter-mapping training samples, which comprise parameters within a predetermined parameter space and outputs of the numerical model generated by executing the numerical model at the first resolution using the parameters within the predetermined parameter space; and
   training the parameter-mapping model using the obtained parameter-mapping training samples.

5. The computer-implemented method of claim 4, wherein obtaining the parameter-mapping training samples further comprises up-mapping the outputs of the numerical model from the first resolution to the second resolution.

6. The computer-implemented method of claim 4, wherein obtaining the parameter-mapping training samples further comprises preprocessing outputs of the numerical model to facilitate the training of the parameter-mapping model.

7. A computer system comprising:
   a processor; and
   a storage device coupled to the processor and storing instructions which when executed by the processor cause the processor to perform a method, the method comprising:
      obtaining, using a first machine-learning technique, a parameter-transform model for mapping parameters of a numerical model other than the parameter-transform model at a first resolution to parameters of the numerical model at a second resolution, wherein the second resolution is higher than the first resolution, and obtaining the parameter-transform model comprises:
         obtaining parameter-transform training samples comprising a set of training parameters of the numerical model associated with the first resolution and a corresponding set of training parameters of the numerical model associated with the second resolution; and
         training the parameter-transform model using the obtained parameter-transform training samples;
      performing a parameter-tuning operation on the numerical model at the first resolution to obtain a first set of tuned parameters; and
      applying the parameter-transform model on the first set of tuned parameters to obtain a second set of tuned parameters at the second resolution;
      generating behavior information associated with the physical system by running the numerical model at the second resolution using the second set of tuned parameters; and
      obtaining, using a second machine-learning technique, a parameter-mapping model for mapping an output of the numerical model to actual parameters used for running the numerical model at the first resolution.

8. The computer system of claim 7, wherein the set of training parameters of the numerical model associated with the first resolution is obtained by applying the parameter-mapping model to outputs of the numerical model running at the second resolution; and wherein the set of training parameters associated with the second resolution comprises actual parameters used for generating the outputs by executing the numerical model at the second resolution.

9. The computer system of claim 7, wherein the parameter-mapping model comprises a deep neural network.

10. The computer system of claim 7, wherein the method further comprises:
obtaining parameter-mapping training samples, which comprise parameters within a predetermined parameter space and outputs of the numerical model generated by executing the numerical model at the first resolution using the parameters within the predetermined parameter space; and
training the parameter-mapping model using the obtained parameter-mapping training samples.

11. The computer system of claim 10, wherein obtaining the parameter-mapping training samples further comprises up-mapping the outputs of the numerical model from the first resolution to the second resolution.

12. The computer system of claim 10, wherein obtaining the parameter-mapping training samples further comprises preprocessing outputs of the numerical model to facilitate the training of the parameter-mapping model.

13. A computer-implemented method comprising:
obtaining, using a machine-learning technique, a parameter-transform model for mapping parameters of a numerical model other than the parameter-transform model at a first resolution to parameters of the numerical model at a second resolution, wherein the second resolution is higher than the first resolution, the numerical model comprises a deep regression network, and the parameter-transform model comprises a gradient-boosting regression model;
performing a parameter-tuning operation on the numerical model at the first resolution to obtain a first set of tuned parameters;
applying the parameter-transform model on the first set of tuned parameters to obtain a second set of tuned parameters at the second resolution; and
generating behavior information associated with the physical system by running the numerical model at the second resolution using the second set of tuned parameters.

* * * * *